United States Patent [19]

Cachon

[11] 3,711,081

[45] Jan. 16, 1973

[54] SEMICONDUCTOR WAFER CHUCK

[75] Inventor: Rene P. Cachon, Wappingers Falls, N.Y.

[73] Assignee: International Business Machines Corporation, Armonk, N.Y.

[22] Filed: March 31, 1970

[21] Appl. No.: 24,256

[52] U.S. Cl. ......................269/21, 269/24, 269/35, 269/305

[51] Int. Cl. ..........................B23q 3/08, B25b 11/00

[58] Field of Search ..........................269/12, 20-24, 269/35, 305, 308

[56] References Cited

UNITED STATES PATENTS

| | | | |
|---|---|---|---|
| 3,475,097 | 10/1969 | Bishop | 269/21 X |
| 2,836,242 | 5/1958 | Ervin | 269/305 X |
| 3,192,844 | 7/1965 | Szasz | 95/73 |
| 3,499,714 | 3/1970 | Schellenberg | 356/138 |
| 3,108,791 | 10/1963 | Budney | 269/20 |
| 3,412,991 | 11/1968 | De Naples | 269/35 |
| 3,484,093 | 12/1969 | Mermelstein | 269/21 |
| 3,555,936 | 1/1971 | Burge | 269/20 X |
| 3,572,736 | 3/1971 | Lynch | 269/21 X |
| 3,595,555 | 7/1971 | Cameron | 269/20 |

OTHER PUBLICATIONS

Von Kaenel, W.; "Vacuum Chuck"; IBM Technical Disclosure Bulletin; Vol. 6, No. 7, Dec. 1963, page 61.

*Primary Examiner*—Granville Y. Custer, Jr.
*Assistant Examiner*—E. F. Desmond
*Attorney*—Hanifin and Jancin and William J. Dick

[57] ABSTRACT

This patent discloses apparatus for accurately aligning a semiconductor wafer to a photo mask, the apparatus disclosed comprising a base and a frame for the apparatus. The base portion includes a chamber in which is mounted a piston which is restrained from lateral movement while permitting vertical reciprocation thereof. In the upper portion of the piston is a socket which supports a gimbal, the gimbal including means for receiving a wafer thereon. Mounted on the frame is a carriage which includes means for positioning a mask in superimposed overlapping relation relative to the gimbal while clamping the mask to the frame. Also disclosed is fluid supply means which is connected to the socket so that the gimbal will float on a cushion, for example, of air. The piston is provided with elevating means to cause the piston to raise beyond the point of contact of a wafer mounted on the gimbal with the mask. Also disclosed is means responsive to the increase in fluid pressure which results from the contact of the wafer with the mask for stopping the elevating means and thus the piston. Thereafter the piston is lowered a preset and predetermined amount to thereby space the wafer from the mask permitting adjustment of the base relative to the frame.

Also disclosed is a novel gimbal with a wafer alignment apparatus built in so as to automatically initially position the wafer in a desired predetermined position on the gimbal.

8 Claims, 14 Drawing Figures

INVENTOR
RENE P. CACHON

BY William J. Dick
ATTORNEY

SEMICONDUCTOR WAFER CHUCK

SUMMARY OF THE INVENTION AND STATE OF THE PRIOR ART

The present invention relates to a semiconductor wafer chuck and more particularly relates to a semiconductor wafer chuck having means for permitting proper orientation of the wafer, means for coarsely aligning the wafer on the chuck, and means for clamping the wafer to the chuck.

In the manufacture of integrated circuits, after a semiconductor wafer has been lapped and polished, and a coating of photo resist has been placed upon the wafer, a pattern is exposed on the photoresist material by projecting light through a mask, the mask having the necessary indicia thereon for placing a repetitive pattern by exposure in the photoresist. As devices have been reduced in physical size, and as interconnecting lines have also been reduced in size, and as the number of devices both active and passive has increased in the individual chips on the wafer, alignment of the wafer to the mask, especially after, for example, a plurality of diffusions has taken place, becomes more and more critical. The reason for the criticality of the exact positioning of the mask to the wafer lies in economics. For example, as more and more devices are crowded into individual chips on a wafer, it becomes necessary to increase line and device definition as well as eliminate, as much as possible, tendencies for edge portions of the wafer to be scrapped because of line misplacement and misalignment. Thus reduced yield from a wafer increases the unit cost per integrated circuit chip.

Wafer to mask alignment devices are well known in the art, for example, see U.S. Pat. No. 3,192,844 of Szasz issued on July 6, 1965. All of the prior art apparatus, however, has basic shortcomings with regard to the accuracy of positioning both with regard to the coplanar attitude of the mask and the wafer, and with regard to horizontal misalignment between the two. Additionally, none of the prior art apparatus is accurate enough when dealing with line widths or interconnection widths on the order of 0.0001–0.0002 inch. The problem of being able to first accurately make the wafer and mask lie in the same plane by abutment of one against the other as well as the difficulty encountered in attempting to reposition the wafer after the wafer has been separated from the mask for horizontal alignment, and then bringing the wafer back into contact with the mask for exposure in precisely the correct position, becomes magnified by the extremely small line and device parameters being dealt with. The separation of the wafer from the mask for subsequent alignment of the wafer in a horizontal plane is necessary to prevent ruining the mask because of epitaxial spikes and the like on the wafer scratching the mask ruining the design or scratching the surface in such a way as to prevent proper light impingement upon the surface of the wafer. Accordingly, it is absolutely necessary that the wafer be leveled so that it lies in a plane parallel with the mask, the wafer then be separated from the mask and aligned in a horizontal plane with the proper design points on the mask, and then repositioned so as to come into contact with the mask for ultimate exposure. Prior art designs just do not permit of this much movement of the wafer or mask, relative to each other, without misalignment.

In view of the above, it is a principal object of the present invention to provide apparatus which automatically aligns the wafer on a wafer chuck while clamping the wafer thereto.

Another object of the present invention is to provide a novel wafer chuck wherein the means for aligning the wafer on the chuck are retractable such that in subsequent steps of bringing the wafer into contact with the mask, the alignment fixtures do not contact the mask.

Still another object of the present invention is to provide retractable alignment means for coarsely aligning the wafer on the chuck.

Yet another object of the present invention is to provide novel retractable locator means to insure proper orientation of the wafer on said chuck.

Another object of the present invention is to provide, in the wafer chuck, novel wafer elevator means to raise the wafer above the surface of the chuck to thereby facilitate removal of the wafer from the chuck.

Other objects and a fuller understanding of the invention may be had by referring to the following specification and claims taken in conjunction with the accompanying claims in which:

Figure 4:
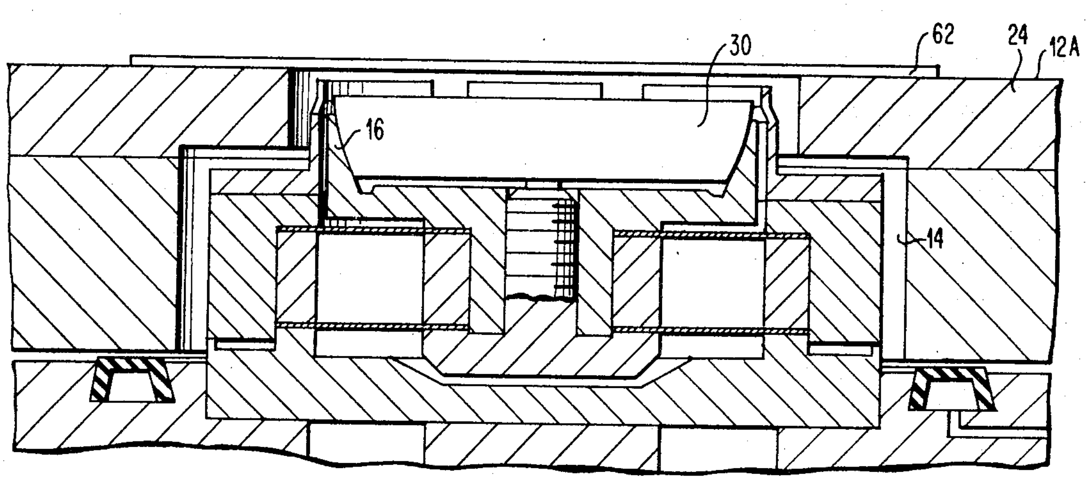
FIG. 4 is an enlarged fragmentary sectional view of a portion of the apparatus illustrated in FIGS. 2 and 3 and showing the first step in aligning a mask to a semiconductor wafer.
Figure 5:
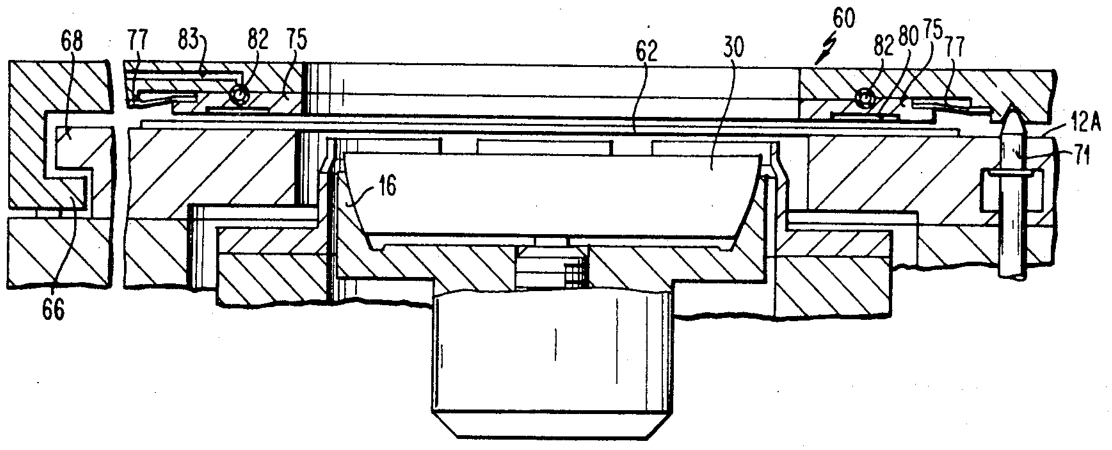
FIG. 5 is a fragmentary sectional view similar to FIG. 4 and illustrates the second step in aligning a mask to the semiconductor wafer.
Figure 6:
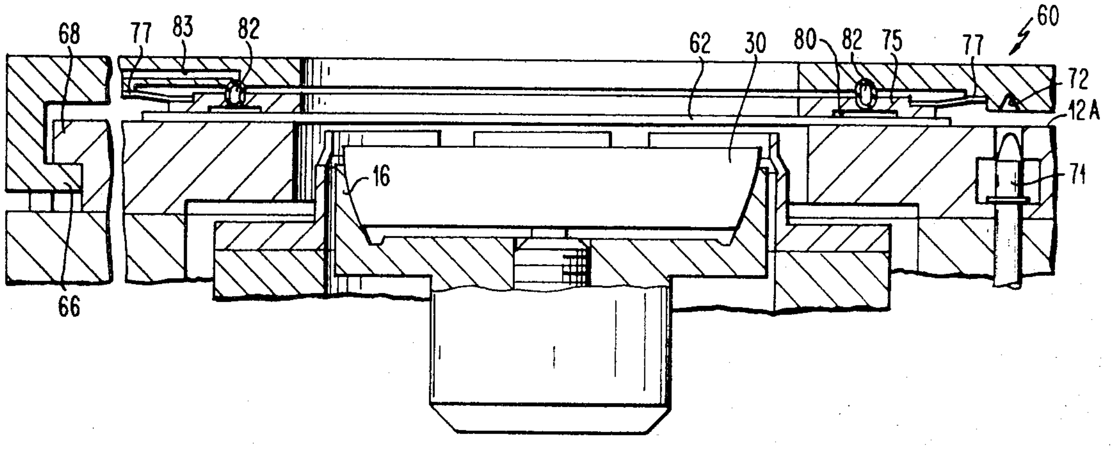
FIG. 6 is a view similar to FIGS. 4 and 5 and illustrates the third step in aligning a mask to a wafer in accordance with the invention.
Figure 7:
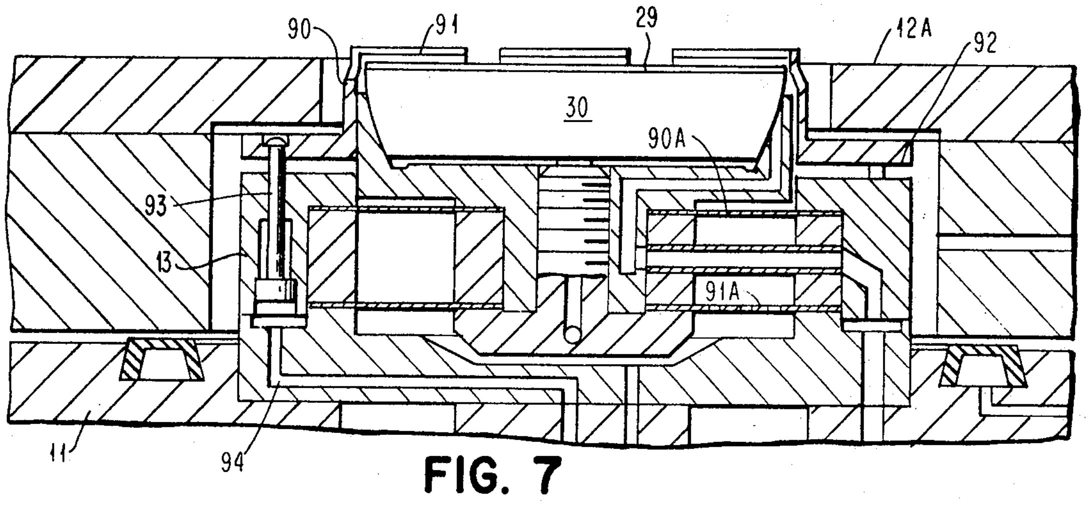
Figure 8:
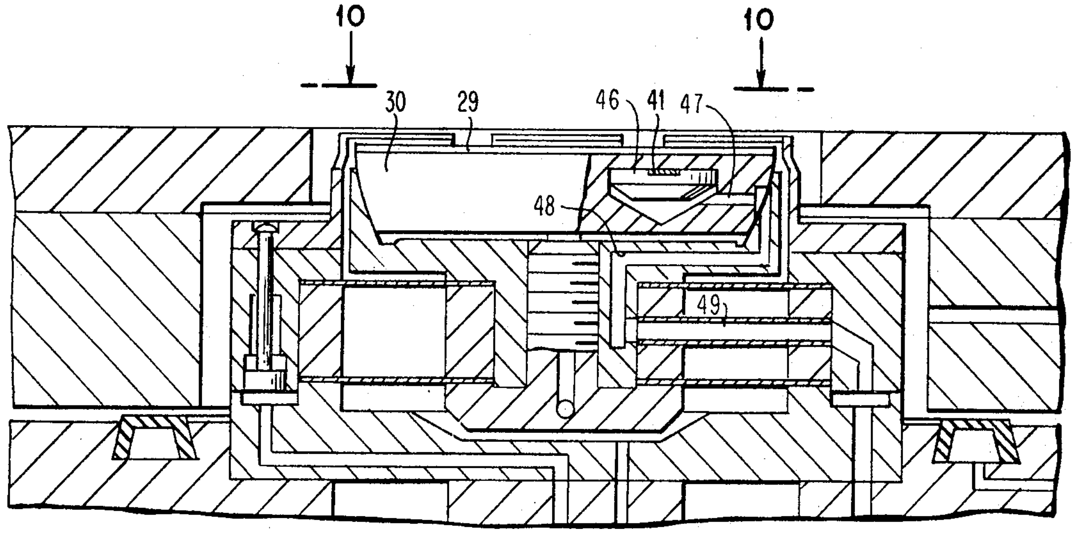
Figure 9:
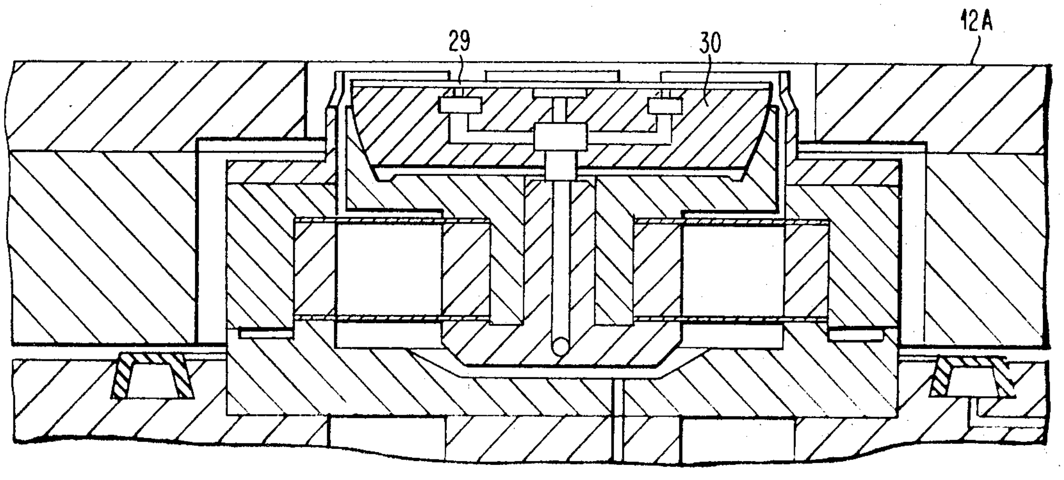
Figure 11:
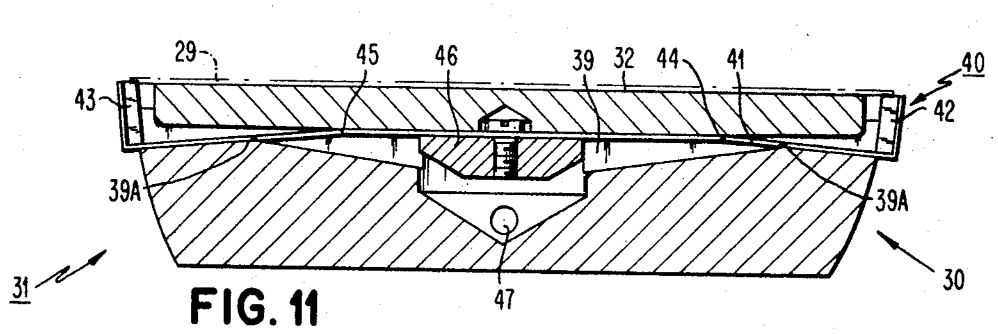
Figure 10:
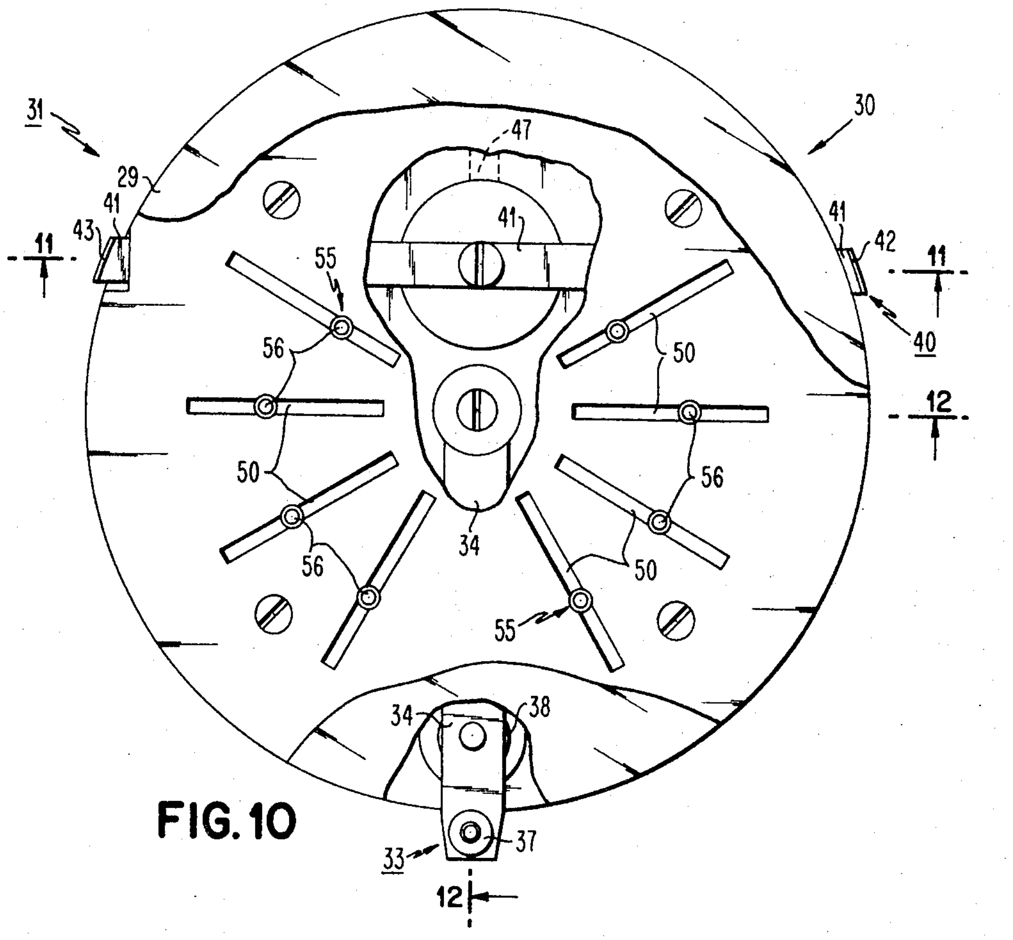
Figure 12:
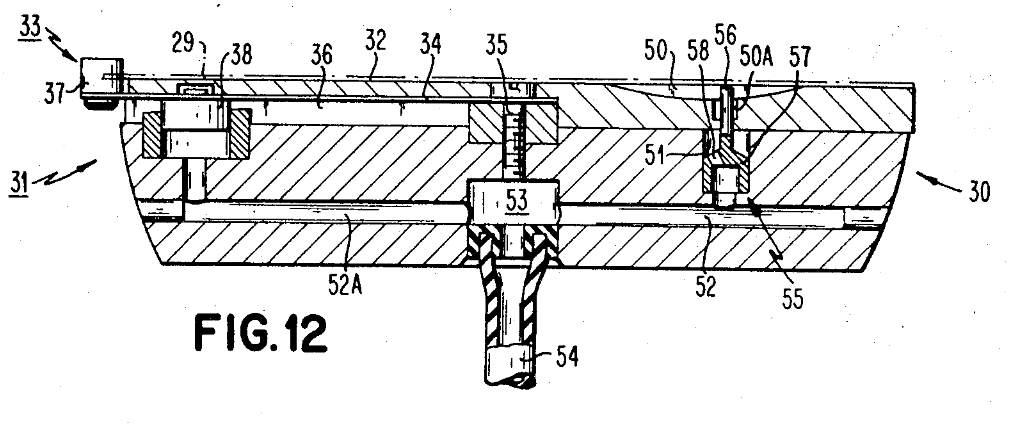
Figure 13:
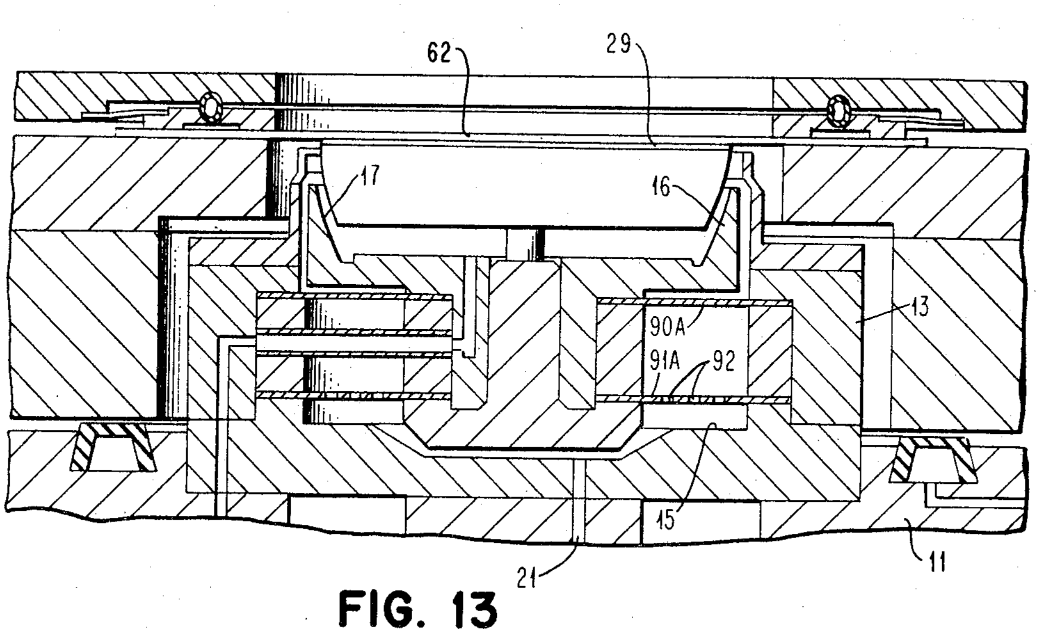
Figure 14:
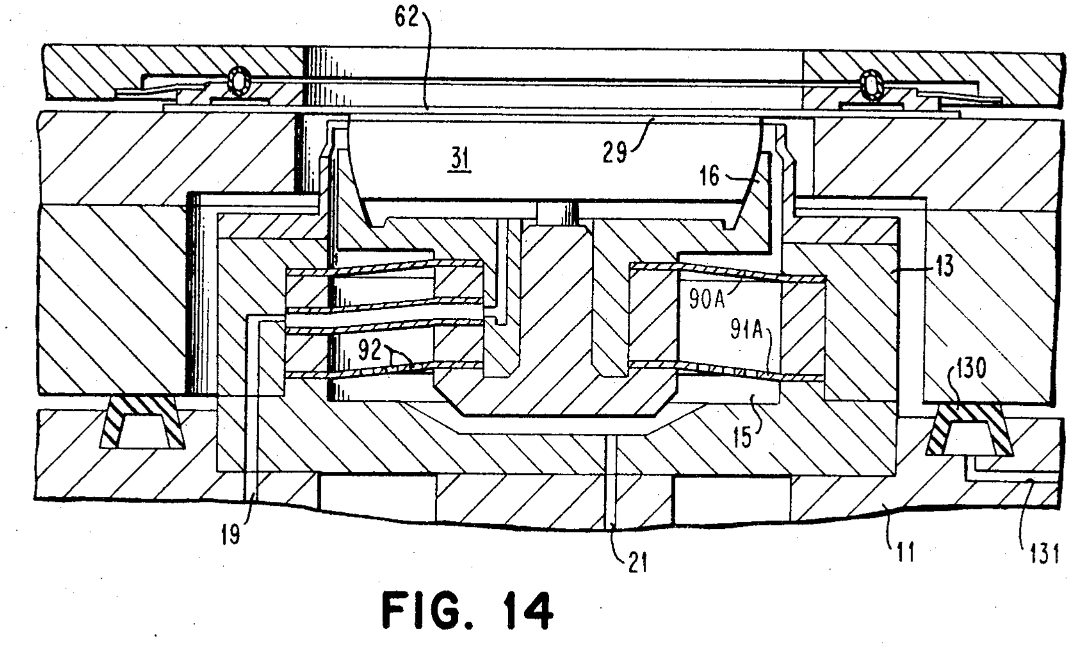

FIGS. 7, 8, and 9 are similar to FIGS. 4, 5, and 6 and illustrate subsequent steps of aligning the mask and wafer;

FIG. 10 is an enlarged fragmentary sectional view of a portion of the apparatus shown in FIGS. 4 to 9 and taken along line 10—10 of FIG. 8;

FIG. 11 is a sectional view taken along line 11—11 of FIG. 10;

FIG. 12 is a revolved fragmentary sectional view taken along line 12—12 of FIG. 10 and opened out to illustrate another portion of the apparatus shown in FIG. 10;

FIG. 13 is a fragmentary sectional view similar to that shown in FIGS. 4–9 and illustrating a step in the alignment of a wafer to a mask in accordance to the invention; and FIG. 14 is a fragmentary sectional view similar to FIG. 13 and illustrating the apparatus in another step prior to removal of the wafer and the mask.

Figure 1:
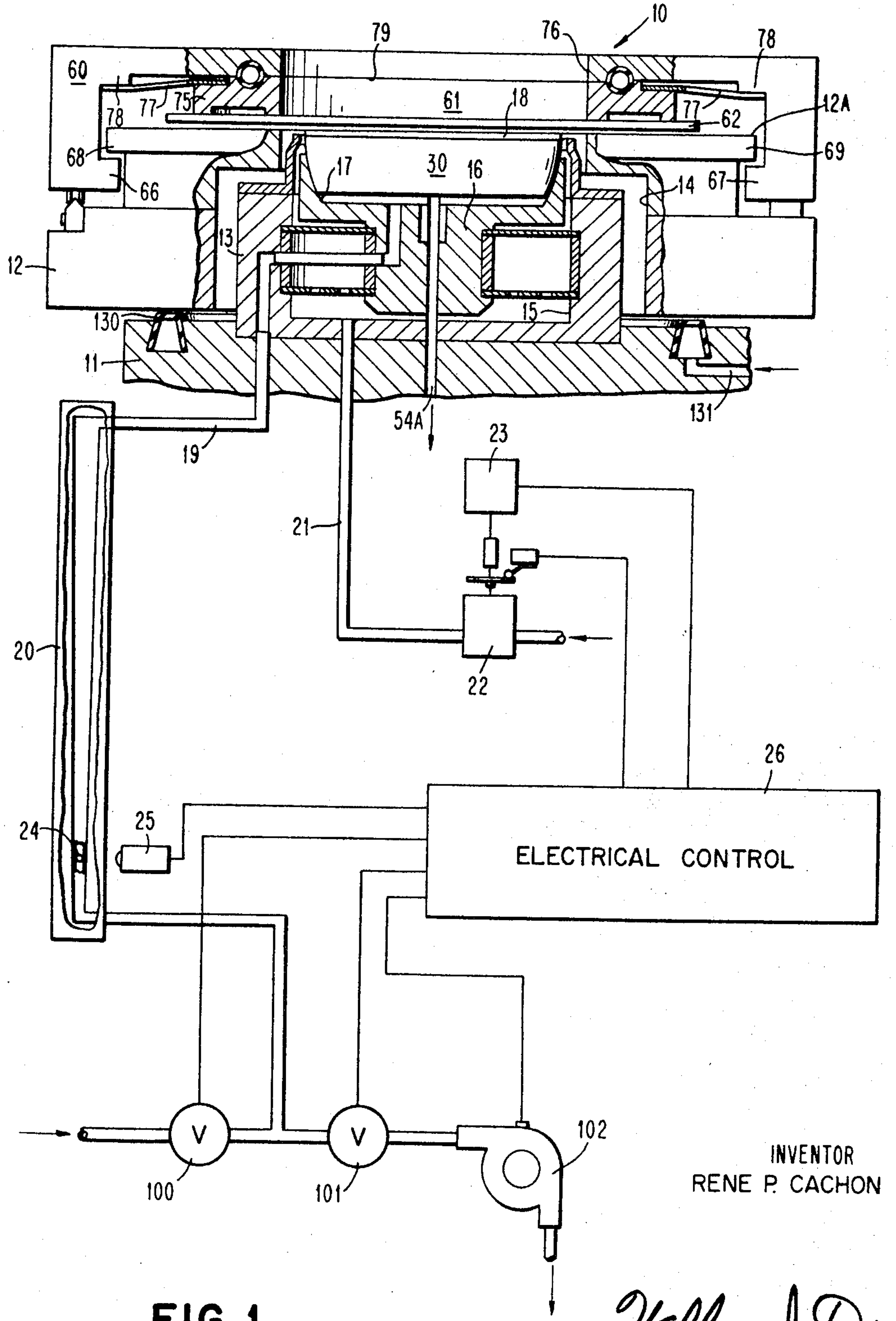
FIG. 1 is a fragmentary schematic view of apparatus embodying the present invention.

Referring now to the drawings and specifically FIG. 1 thereof, apparatus 10 constructed in accordance with the present invention is illustrated therein, the apparatus comprising generally a base portion 11 which is movable with respect to a frame 12, the base including an upstanding ring-like portion 13 which is received in a bore 14 passing vertically through the frame 12. The base includes a chamber 15 in which is mounted a piston 16, the piston including a socket 17 for receiving a wafer chuck 30. Riding on the frame 12 is a carriage 60 including a photo mask chuck 61 for positioning a photo mask 62 in superimposed overlapping relation with respect to the wafer chuck 30.

Although the method of operation of the apparatus will be more fully explained hereinafter, the various steps of the operating sequence for aligning the mask and semiconductor wafer in superimposed relation for exposure, for example, of photoresist on the wafer, is set forth to facilitate understanding of the apparatus. Referring to FIG. 1, the mask is positioned overlying the bore 14 and wafer chuck 30, and the mask is lowered into position until it contacts the upper surface 12A of the frame 12. Assuming that a wafer 18 is positioned on the wafer chuck 30, the socket 17 of the piston 16 is supplied with air as through the piping 19 and flow gauge 20 thereby floating the wafer chuck in the socket 17. Air passing out of the socket will enter into the bore 14 and escape from the apparatus between the base and frame. Thereafter air is supplied to the chamber 15 through air line 21 via pressure regulator 22, the pressure of the air in the chamber being controlled by a stepping motor or the like 23. As the piston 16 is elevated, the wafer 18 contacts the underside of the photo mask 62, and due to the shape of the wafer chuck, aligns the wafer surface in the same plane as the lower surface of the mask. Increased pressure in the chamber 15 causes the piston to raise further causing the wafer chuck 30 to be pressed into its socket 17 decreasing the air flow through the flow gauge 20. As air flow into the socket 17 decreases, a ball 24 in the flow gauge gradually moves downwardly until it is aligned with a proximity sensor 25, which through an electrical control 26 cuts off the stepping motor 23 controlling the regulator 22. This sets the regulator so that no increased air pressure is introduced into the chamber 15 thereby stopping the upward vertical movement of the piston. At that point air flow is reversed through the flow gauge and a vacuum is applied through the flow gauge 20, locking the wafer chuck 30 in its socket and the stepping motor 23 is reversed counting down a predetermined number of steps to remove at least some of the pressure in the chamber 15 so that the piston 16 moves downwardly to space the wafer from the mask. Thereafter, using an optical technique, such as shown in the copending application of Schmid entitled "Apparatus for Aligning Photo Masks with Semi-Conductive Wafers," Ser. No. 24,259, filed contemporaneously herewith, the base 11 is moved in a horizontal plane as by apparatus such as shown in the copending application of Cachon, entitled "Manipulation Apparatus," Ser. No. 24,258, also filed contemporaneously herewith, to align indicia on the wafer with indicia on the mask. Thereafter by using, for example, conventional counters in the electric control 26, the stepping motor 23 is again driven so as to raise the pressure in the chamber 15, the stepping motor now counting up the same number of steps counted down to bring the wafer into contact with the mask for exposure.

In order to better understand the operation of the apparatus the steps involved including the pertinent portions of the apparatus will be discussed in the order of which a mask and wafer contact exposure cycle is made.

MASK HANDLING

Referring first to FIG. 4, a photo mask 62 having indicia (not shown) thereon is positioned by an optical system, such as heretofor alluded to in the application of Schmid, to roughly position the mask over the bore 14 and wafer chuck 30.

Figure 2:
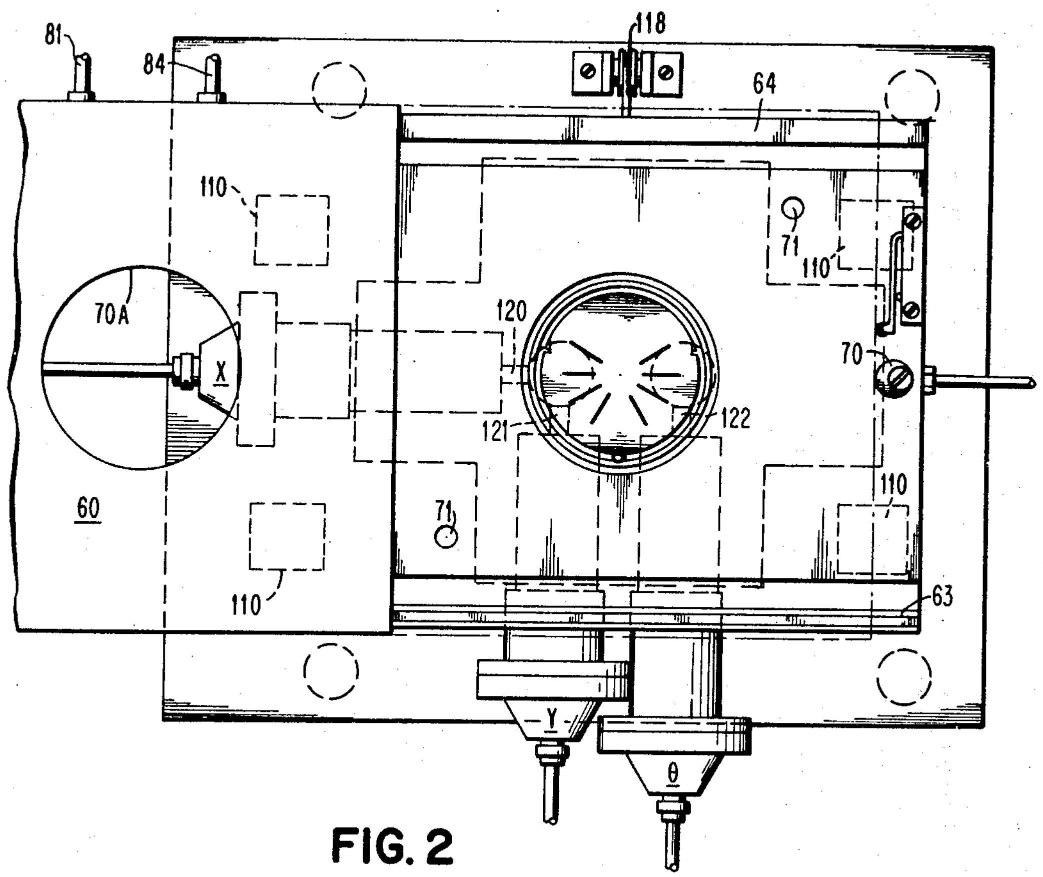
FIG. 2 is a fragmentary plan view of a portion of the apparatus illustrated schematically in FIG. 1.
Figure 3:
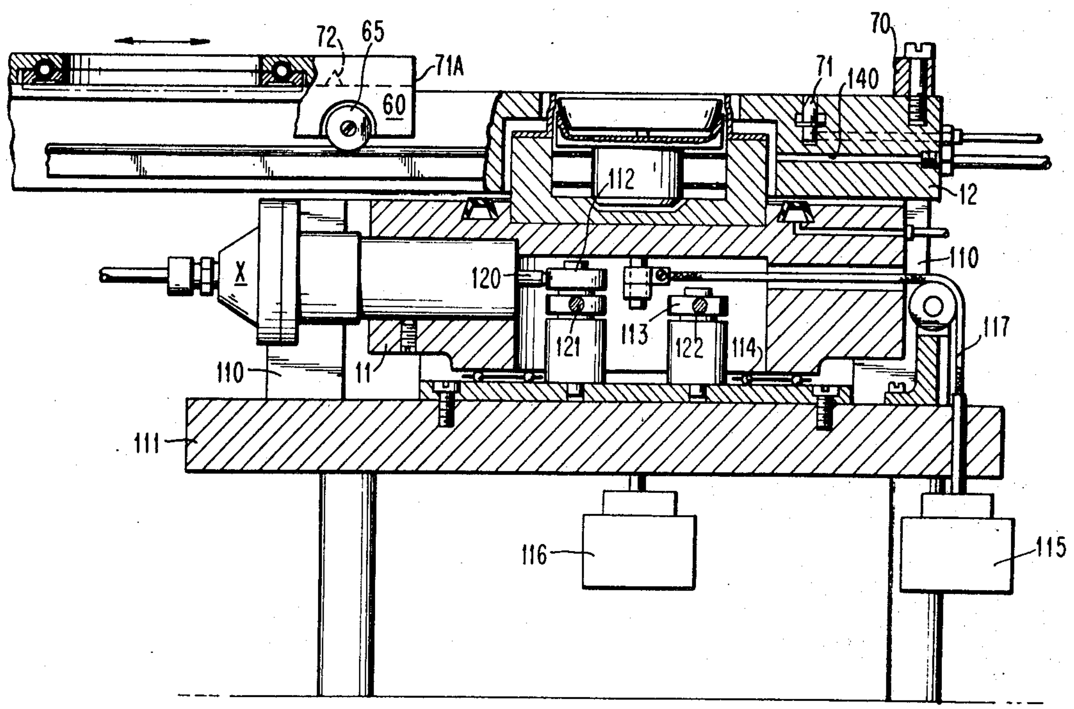
FIG. 3 is a fragmentary sectional view taken along line 3—3 of FIG. 2.

In order to clamp the mask to the surface 12A on the frame while permitting retraction of the mask for wafer insertion and subsequent repositioning of the mask for alignment and exposure, the carriage 60 is mounted for reciprocation along tracks 63 and 64 or guides on the frame 12. To this end, and as best shown in FIGS. 2 and 3, the carriage 60 includes wheels 65 which cooperate with the tracks 63 and 64 to permit reciprocation of the carriage 60. Additionally, as best shown in FIG. 1, the carriage includes inturned flange sections 66 and 67 which underlie projecting lip portions 68 and 69 on the frame 12. As illustrated in the drawings, the carriage includes a central aperture 70A which permits viewing of the mask and thus a wafer held by the wafer chuck 30 when the carriage is superimposed of the bore 14.

In order that the carriage will always be positioned at the same place when removed and reinserted over the bore 14, means are provided for bringing the carriage 60 to the same rest position superimposed of the wafer 30. To this end, a rough stop 70 (FIGS. 2 and 3) is positioned for abutment against one end 71A of the carriage 60, an exact carriage positioning means, in the illustrated instance at least one piston 71, is elevated into a conical recess 72 in the underside of the carriage, the piston 71 and recess 72 cooperating to permit repetitive positioning of the carriage relative to the bore 14 in thr frame 12. It should be recognized that the piston 71 may be actuated by any convenient mechanism such as air, solenoid, etc. Additionally, it is preferable to position two such pistons to mate with recesses at opposite corners of the carriage to aid in stabilization.

Assuming that the carriage 60 has moved until the one end 71A abuts the stop 70 and the pistons 71 have been actuated to accurately position the carriage, the mask chuck 61 is then lowered to engage the mask, raising the mask and permitting retraction of the carriage 60 for insertion of a wafer onto the wafer chuck 30. To this end, and referring now to FIGS. 1, 5, and 6, the mask chuck 61 comprises a frame 75 having a central aperture 76 identical in dimension to the aperture 70A in the carriage 60. The frame 75 is connected by way of biasing means, in the illustrated instance leaf springs 77, to outboard portions 78 of the carriage 60, the springs 77 serving to bias the frame 75 upwardly against the lower surface 79 of the carriage 60. The lower portion of the frame 75 includes a slot or recessed portion 80 which is connected to a vacuum supply such as by a hose 81 (see FIG. 2). The vacuum supply to the hose 81 may be energized at the convenience of the operator by any well-known means.

In order to place the mask chuck 61 against the upper surface of the photo mask 62, means are provided for lowering the frame 75 so that the slot or recessed portion 80 abuts the mask for engagement therewith. To this end a doughnut-shaped ring of expandable tubing 82 is positioned intermediate the underside 79 of the carriage 60 and the upper portion of the frame 75, whereby, upon pressurizing the tube 82 via the conduit 83 and tubing 84 (see FIG. 2) the biasing effect of the springs 77 is overcome causing the frame 75 to come into contact with the mask. Thereafter a vacuum is applied to a recessed portion 80 and the mask is clamped. Additionally, pressure exerted on the mask frame 75 and against the underside 79 of the carriage causes the flanges 66 and 67 to be elevated into engagement with the lips 68 and 69 respectively on the frame, thereby locking the carriage to the frame.

WAFER CHUCK

After the mask 62 has been clamped by the mask chuck 61, the tube 82 is deflated and the biasing effect of the springs 77 raises the chuck 61 above the surface 12A of the frame, this of course results in the disengagement of the flanges 66 and 67 from the lips 68 and 69 of the frame so that the carriage 60 may be retracted to the position shown in FIG. 3. At this point the wafer must be inserted into the wafer chuck for alignment of the wafer with the mask and ultimate exposure.

In accordance with one feature of the invention the wafer 29 is inserted onto the wafer chuck, roughly positioned thereon, and then clamped to permit engagement of the wafer with the mask for coplanar alignment and for ultimate exposure. To this end and referring to FIGS. 7, 8, and 10–12, circumscribing the wafer chuck 30 and recessed below the upper surface 12A of the frame 12 is a cup 90 having a beveled lip 91 divided into a plurality of segments spaced from each other and circumscribing the chuck 30. The cup includes a radially extending annular flange portion 92 which is connected through a plurality of equally spaced piston-like elements 93 extending through the upstanding ring-like portion 13 of the base 11. The pistons 93 are disposed circumferentially of the cup 90, engaging the flange 92 so that upon actuation of the pistons, as through applying air pressure through lines 94, the cup is elevated. In this position it is a simple matter for the operator to insert a wafer onto the wafer chuck, the cup serving, while in its elevated position (FIG. 7), to guide the wafer onto the upper surface of the wafer chuck.

As the wafer is inserted onto the wafer chuck it is located and roughly positioned on the chuck for subsequent operations of the apparatus. To this end, and referring now to FIGS. 10–12, the wafer chuck 30 comprises a gimbal 31 which includes a solid of revolution formed by rotating a curvilinear line about a central axis, the gimbal having in the illustrated instance a frusto-hemispherical shape to permit automatic levelling (in a manner which will be more fully explained hereinafter) and coplanarity of the wafer 29 held by the chuck 30 with the mask 62. As illustrated, the gimbal 31 includes a substantially planar surface 32 for receiving the wafer thereon.

As most wafers have either a flat along one portion of the periphery or a notch, for orienting purposes locator means 33, normally positioned so as to project above the planar surface 32 of the gimbal 31, is provided. In order to bring the wafer against the locator, guide means 40 are disposed on the periphery of the gimbal and are adapted for gently displacing the wafer (if necessary) so as to permit the flat or notch on the wafer to engage the locator 33. To this end, the guide means 40 comprises a deflectable member 41 which is disposed in slot 39, which extends transversely of the gimbal underlying the planar surface 32. As shown in FIG. 10, the guide means includes opposite terminal ends or upstanding first and second flanges 42 and 43 which project from opposite sides of the gimbal along the periphery of the planar surface 32. The slot 39 includes a cam portion 39A which bears against the deflectable member 41 which has a downward bend as at 44 and 45 so as to permit cooperation of the member with the cam portions 39A. Centrally disposed of the member 41 is a piston 46 which, when actuated through a vacuum line 47, moves the deflectable member 41 against the cam portions 39A elevating the flanges 42 and 43 above the planar surface 42 of the gimbal. In this manner, course alignment of the wafer is effected.

It should be recognized that the shape of the socket 17 is adapted for close fitting with the gimbal 31 so that although the gimbal is free for alignment in an oblique plane, such change of position is relatively small. Thus the vacuum line 47, as shown best in FIG. 8, cooperates with an aperture 48 and conduit 49 to a source of vacuum without a direct mechanical connection.

In order to hold the wafer in place upon rough alignment and orientation thereof by the guide means 40 and locator means 33 the planar surface 32 includes a plurality of radially extending slots 50 therein including apertures 50A which communicate with bored holes 51 leading to transverse conduits 52, all communicating with a central pocket 53 connected to flexible tubing 54. The bored holes include small elevators or pistons 55 which include a pin portion 56 extending into the slot 50 but underlying the planar surface 32 of the gimbal. The pin 56 is connected to a tubular base portion 57 and a slot 58 so air may be drawn through the aperture 50A, bored holes 51, slot 58 and conduit 52 into the pocket 53. As is evident, application of a positive pressure through the tubing 54 into the conduit 52 will cause the pistons to elevate lifting the wafer from the planar surface 32 when desired.

Inasmuch as the wafer, as has been heretofor explained, is to be elevated into contact with the lower surface of the mask so that the wafer assumes a coplanar attitude with respect to the mask, it is desirable to cause withdrawal of the locator as the wafer is clamped to the upper planar surface by the vacuum. To this end, and as best shown in FIG. 12, the locator 33 includes a beam 34 which is cantilevered by connection to a screw 35, to the illustrated instance centrally located in the gimbal 31. A slot 36 extending transversely of the gimbal underlies the planar surface 32 and houses the beam 34. As shown the beam extends out of the gimbal and terminates in an upstanding post 37. A cavity 38 in the gimbal embraces a piston 38A which is connected to the beam intermediate its ends. As illustrated in FIG. 12 the cavity is connected to a conduit 52A and thus to the pocket 53 so that upon application of a vacuum through the tubing 54, the piston 38 will be lowered thus withdrawing or recessing the post 37 below the surface 32 of the gimbal 31.

As best illustrated in FIGS. 1 and 12 the tubing 54 is preferably of a flexible variety to permit oblique movement of the wafer chuck 30 (and thus the gimbal 31) in the socket 17. The tubing 54, as best illustrated in FIG. 1, is connected via an internal conduit 54A to a switchable vacuum and positive pressure source to permit, as desired, positive clamping of the wafer to the chuck as well as withdrawing or recessing of the locator 33 or alternatively to permit elevation of the pistons 55 and raising of the wafer 29 from the planar surface 32 of the gimbal 31.

WAFER CHUCK FLOAT, AND WAFER CONTACT WITH MASK

After the wafer has been clamped on the upper surface 32 of the wafer chuck 30, and the cup 90 has been brought down so that the lip 91 does not project above the surface of the frame 12A, the carriage 60 with the mask 62 held by the mask chuck 61 is brought into position and the pistons 71 (FIG. 2) is elevated so as to reposition the carriage so that the mask 62 overlies the wafer chuck 30. At that point the doughnut-shaped tube 82 is expanded and the wafer chuck 61 is lowered until the mask is positioned against the surface 12A of the frame. This action, as has heretofor been described relative to FIG. 6, causes the flanges 66 and 67 to engage the lips 68 and 69 thereby locking the carriage to the frame. Thereafter air is applied through the flow gauge 20 and line 19 to the socket 17 causing the gimbal 31 to float in the socket on a cushion of air. It should be recognized that the spacing between the socket and the gimbal as well as the height of elevation illustrated in FIG. 13 is exaggerated for purposes of clarity.

Thereafter, in order to elevate the wafer 29 into contact with the undersides of the mask 62, the piston 16 is elevated by applying a positive air pressure into the chamber 15 causing vertical movement of the piston.

In accordance with one feature of the invention, and to inhibit any lateral movement of the piston 16 while it is being elevated, means are provided for restraining the piston in a lateral direction while permitting limited movement of the piston in the vertical direction. To this end and as illustrated best in FIGS. 13 and 14, a pair of annular diaphragms 90A and 91A are connected to both the piston and the ring-like portion 13 of the base 11. As shown, the diaphragms are axially spaced apart to provide lateral rigidity while the bottom or lowermost diaphragm 91A is provided with a plurality of apertures 92 therein to permit air entering into the chamber 15 to pass through the diaphragm 91A and act upon the diaphragm 90A. The diaphragms are preferably composed of a relatively resilient but strong material such as spring steel.

As pressure builds up in the chamber 15 the piston 16 is elevated and the diaphragm 90A and 91A assume a shape generally as illustrated in FIG. 14. Additionally, as the piston is elevated, the wafer 29 contacts the mask 62 and the gimbal 31 automatically aligns in socket 17 so that the wafer and mask are in the same contact plane. Additionally, as the wafer contacts the mask, the gimbal 31 is driven into the socket 17 and air pressure in the line 19 builds up while air flow decreases. As air flow decreases, and as heretofor described with reference to FIG. 1 the ball 24 drops in the flow gauge until the proximity sensor 25 causes the stepping motor to cut off the regulator 22. Thereafter, through the electrical controls 26 (see FIG. 1) the air valve 100 is shut off and the vacuum valve 101, as driven by a vacuum pump 102, causes a suction to be placed in the socket 17 thereby locking the gimbal 31 in the socket. Then, as has heretofor been explained, the stepping motor is reversed and the piston 16 is lowered in the chamber 15 by decreasing air pressure in the chamber. The base 11 is then aligned through the optics so that indicia on the wafer 29 aligns with indicia on the mask 62.

Apparatus to effect manipulation of the base 11 is described in the copending application of Cachon, while the principal of X, Y, and $\theta$ alignment are set forth in the patent to Brunner et al., U.S. Pat. No. 3,466,514, issued on Sept. 9, 1969. Generally, however, apparatus for aligning the base and thus the wafer to the mask is illustrated in FIGS. 2 and 3 wherein a support 110 is connected to a platform 111, the X, Y, and $\theta$ manipulators being connected to the base 11. The X and Y manipulators engage a post 112 attached to the Table 111 and the $\theta$ manipulator engages a post 113, similarly mounted. As shown, the base 11 is mounted on bearings 114, the base being biased in the X and Y directions as by weights 115 and 116 attached through cord 117, 118 to bias the manipulators against the posts 112 and 113. Thus movement by the X manipulator through its output shaft 120 causes right and/or left (reference FIG. 3) movement of the post 112 while movement of the Y manipulator causes vertical movement (reference FIG. 2) of the post 112 by movement of the output shaft 121 associated with the Y manipulator. Additionally, as the $\theta$ manipulator is connected through its output shaft 122 to the post 113, movement of the output shaft 122 effects movement of the base about post 112.

After proper X, Y, and $\theta$ alignment, it is desirable to seal the bore 14 in the frame 12, for purposes which will become evident hereinafter. Accordingly, a tubular seal element 130 (see especially FIGS. 1 and 14) in the present instance positioned in the base 11, is expanded by applying a positive air pressure through a supply line 131. This causes expansion of the tubular seal element 130 and contact of the same thereby sealing the bore 14 in the frame 12. This occurs because the mask is seated sealing the bore in the upper portion of the frame 12. Additionally, expansion of the seal 130 causes the base to lock to the frame thereby preventing any inadvertent movement of the base relative to the frame.

Thereafter, the stepping motor is once again energized allowing increased air pressure into the regulator 22 and elevating the piston 16 until the wafer 29 contacts the mask. The number of steps that the stepping motor employed to lower the piston to permit X, Y, and $\theta$ alignment to thereby prevent scratching of the mask or the wafer is added to the stepping motor so that the stepping motor will shut off upon engagement of the mask by the wafer. In this manner the wafer 29 contacts the mask at a predetermined pressure sufficient for good exposure through the mask of the photoresist on the wafer.

With some photoresist it is necessary to expose the photoresist in the absence of air and accordingly the seal 130 and mask cooperates to form a seal of the bore 14 and, the bore may then be evacuated as by the line 140 connected to a suitably source of vacuum (not shown). Additionally, if desired, another conduit may be bored through the frame to permit access to the bore 14 so that an inert gas may be supplied to the bore, depending, of course, upon the chemical constituents of the photoresist.

After exposure of the pattern on the mask into the photoresist on the wafer, it is necessary to release the pressure in the chamber 15 to lower the piston 16, spacing the wafer 29 from the mask 62. Thereafter the mask chuck 61 is raised and the carriage 60 withdrawn to permit access to the wafer. A positive pressure is then applied to the flexible tubing 54 and the elevators 55 raise the wafer off the planar surface 32, permitting easy removal of the water. Thereafter a fresh wafer may be inserted and the cycle repeated.

Although the invention has been described with a certain degree of particularity, it is understood that the present disclosure has been made only by way of example and that numerous changes in the details of construction, the method of operation, and the combination and arrangement of parts may be made without departing from the spirit and the scope of the invention as hereinafter claimed.

What is claimed is:

1. A semiconductor wafer chuck comprising an element including at least one substantially planar surface for receiving a wafer thereon; means for applying a vacuum to said surface; guide means mounted peripherally of at least the portion of said surface intended for receipt of said wafer; and means for actuating said guide means between a first raised position above the plane of said surface for contact and guidance of said wafer, and a second recessed position.

2. A semiconductor wafer chuck in accordance with claim 1 wherein said second position is at least below the plane of the upper surface of a wafer mounted on said planar surface.

3. A semiconductor wafer chuck in accordance with claim 1 including locator means along one edge of said chuck and normally projecting above said planar surface; and means for recessing said locator means below said planar surface.

4. A semiconductor wafer chuck comprising an element including at least one substantially planar surface for receiving a wafer thereon; means for applying a vacuum to said surface, said means including a plurality of radially extending slots in said planar surface and piston means in said slots; means in said piston means to permit an application of vacuum to said slots through said pistons and to permit elevation of said pistons above said planar surface upon application of a positive pressure to said pistons; guide means mounted peripherally of at least a portion of said surface intended for receipt of said wafer; and means for actuating said guide means between a first raised position above the plane of said surface for contact and guidance of said wafer, and a second recessed position.

5. A semiconductor wafer chuck comprising an element including at least one substantially planar surface for receiving a wafer thereon; means for applying a vacuum to said surface; a slot extending transversely of said element and underlying said surface; guide means including a deflectable member disposed in said slot and including opposite terminal ends projecting from said element; cam means in said slot bearing against said member; piston means connected to said member; upstanding first and second flanges connected to opposite ends of said member, and means communicating with said piston means to cause movement of said piston and camming of said deflectable member against said cam means thereby effecting reciprocation of said flanges between a first raised position above the plane of said surface for contact and guidance of said wafer, and a second recessed position.

6. A semiconductor wafer chuck comprising an element including at least one substantially planar surface for receiving a wafer thereon; means for applying a vacuum to said surface; guide means mounted peripherally of said surface; and means for actuating said guide means between a first raised position above the plane of said surface for contact and guidance of said wafer and a second recessed position; locator means along one edge of said wafer chuck and normally projecting above said planar surface, a notch along the periphery of said planar surface, a post connected to said locator means and positionable in said notch; and means for recessing said locator means below said planar surface.

7. A semiconductor wafer chuck in accordance with claim 6 including a cavity in said element; a beam extending from said cavity through said element, said beam being connected to said post; piston means connected to said beam in said cavity, and means for effecting reciprocation of said piston in said cavity to thereby cause projection and recession of said post.

8. A semiconductor wafer chuck in accordance with claim 7 wherein said means to effect reciprocation of said piston in said cavity comprises means for applying a vacuum to said cavity.

* * * * *